(12) United States Patent
Jang et al.

(10) Patent No.: US 8,772,916 B2
(45) Date of Patent: Jul. 8, 2014

(54) INTEGRATED CIRCUIT PACKAGE SYSTEM EMPLOYING MOLD FLASH PREVENTION TECHNOLOGY

(75) Inventors: Ki Youn Jang, Ichon-si (KR); Sungmin Song, Inchon (KR); JoHyun Bae, Seoul (KR)

(73) Assignee: Stats Chippac Ltd., Singapore (SG)

( * ) Notice: Subject to any disclaimer, the term of this patent is extended or adjusted under 35 U.S.C. 154(b) by 15 days.

(21) Appl. No.: 13/536,382

(22) Filed: Jun. 28, 2012

(65) Prior Publication Data

US 2012/0267801 A1    Oct. 25, 2012

Related U.S. Application Data

(62) Division of application No. 11/615,919, filed on Dec. 22, 2006.

(51) Int. Cl.
  *H01L 23/31*    (2006.01)
(52) U.S. Cl.
  USPC .............. 257/678; 257/690; 438/64; 438/127; 438/264
(58) Field of Classification Search
  USPC ................................. 257/667, 678
  See application file for complete search history.

(56) References Cited

U.S. PATENT DOCUMENTS

| | | |
|---|---|---|
| 5,108,955 A | 4/1992 | Ishida et al. |
| 5,118,271 A | 6/1992 | Baird et al. |
| 5,347,429 A | 9/1994 | Kohno et al. |
| 5,422,435 A | 6/1995 | Takiar et al. |
| 5,463,253 A | 10/1995 | Waki et al. |
| 5,615,089 A | 3/1997 | Yoneda et al. |
| 5,646,829 A | 7/1997 | Sota |
| 5,801,072 A | 9/1998 | Barber |
| 5,815,372 A | 9/1998 | Gallas |
| 6,057,598 A | 5/2000 | Payne et al. |
| 6,117,382 A | 9/2000 | Thummel |
| 6,198,171 B1 | 3/2001 | Huang et al. |
| 6,319,449 B1 | 11/2001 | Campbell et al. |
| 6,331,453 B1 | 12/2001 | Bolken et al. |
| 6,332,766 B1 | 12/2001 | Thummel |
| 6,358,773 B1 | 3/2002 | Lin et al. |
| 6,400,007 B1 | 6/2002 | Wu et al. |
| 6,521,480 B1 | 2/2003 | Mitchell et al. |
| 6,548,766 B2 | 4/2003 | Daido |
| 6,560,122 B2 | 5/2003 | Weber |
| 6,616,880 B2 | 9/2003 | Thummel |
| 6,656,769 B2 | 12/2003 | Lee et al. |
| 6,660,558 B1 | 12/2003 | Bolken et al. |
| 6,667,439 B2 | 12/2003 | Salatino et al. |
| 6,717,248 B2 | 4/2004 | Shin et al. |
| 6,787,093 B2 | 9/2004 | Kiritani |

(Continued)

FOREIGN PATENT DOCUMENTS

JP    2001047473    2/2001

*Primary Examiner* — Julio J Maldonado
*Assistant Examiner* — Mohammad Choudhry
(74) *Attorney, Agent, or Firm* — Ishimaru & Associates LLP

(57) ABSTRACT

An integrated circuit package system that includes: a support structure including an electrical contact; a solder mask over the support structure, the solder mask including a solder mask flange, the solder mask flange directly on a support structure first surface; an integrated circuit over the support structure; and encapsulant over the integrated circuit and in contact with the solder mask flange. A mold system that includes a first mold having a projection along a first mold bottom surface, the projection between a first cavity and a recess.

5 Claims, 5 Drawing Sheets

(56) References Cited

U.S. PATENT DOCUMENTS

| | | |
|---|---|---|
| 6,817,854 B2 | 11/2004 | Hundt et al. |
| 6,867,487 B2 | 3/2005 | Huang et al. |
| 7,049,166 B2 | 5/2006 | Salatino et al. |
| 7,147,447 B1 | 12/2006 | Takahashi |
| 7,190,067 B2 | 3/2007 | Chen et al. |
| 7,323,767 B2 | 1/2008 | James et al. |
| 7,368,391 B2 | 5/2008 | Tan et al. |
| 7,425,758 B2 | 9/2008 | Corisis et al. |
| 7,504,736 B2 | 3/2009 | Kim et al. |
| 2002/0084537 A1 | 7/2002 | Cheng et al. |
| 2006/0076695 A1 | 4/2006 | Hsieh et al. |
| 2007/0262473 A1 | 11/2007 | Yim et al. |

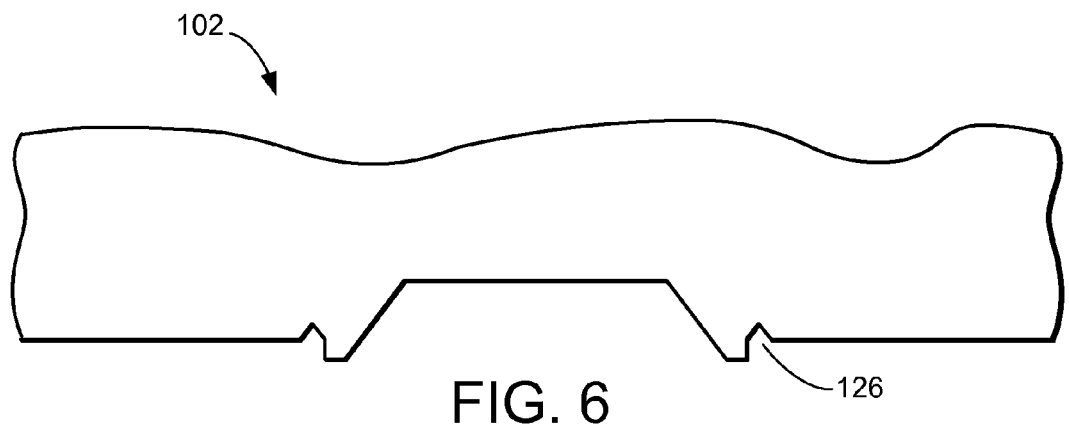
FIG. 6
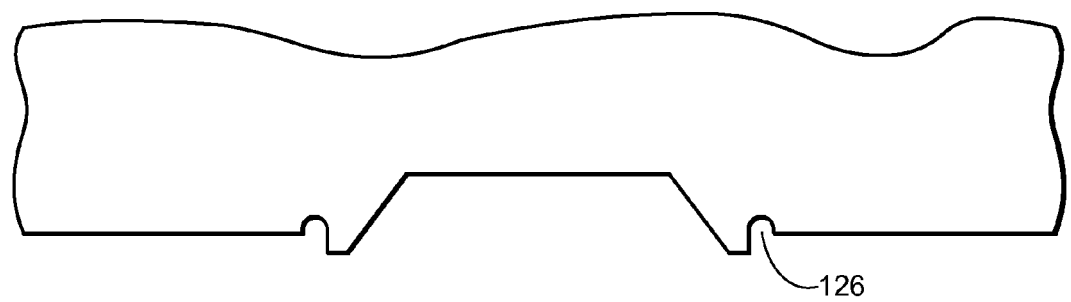
FIG. 7
FIG. 8

INTEGRATED CIRCUIT PACKAGE SYSTEM EMPLOYING MOLD FLASH PREVENTION TECHNOLOGY

CROSS-REFERENCE TO RELATED APPLICATION(S)

This is a divisional of co-pending U.S. patent application Ser. No. 11/615,919 filed Dec. 22, 2006, and the subject matter thereof is hereby incorporated herein by reference thereto.

TECHNICAL FIELD

The present invention relates generally to integrated circuits, and more particularly to an integrated circuit package system employing mold flash prevention technology.

BACKGROUND ART

Integrated circuits are what power many of today's consumer electronics. Integrated circuits can be found in cell phones, video cameras, portable music players, computers, and even automobiles. As customer demand improves integrated circuit (IC) performance, faster, more reliable, and higher-density circuits need to be produced. Various techniques, such as, stacked die packages and multi-chip modules (MCM), have been developed to meet the continued demands for improving system performance. Commonly, these package structures are formed with a top mold side for device protection and a bottom solder ball side for electrical interconnection.

As demand continues towards a higher density of integrated circuits within a package, vertical integration requires that these protective mold configurations and electrical solder ball pad sites sometimes be formed on the same side. A common example of such a configuration is the board-on-chip design. The board-on-chip design commonly employs a protective mold configuration adjacent an electrical solder ball pad pattern.

Frequently, these packages have a very short mold to solder ball pad clearance. Consequently, the solder ball pad sites adjacent the mold are commonly invaded by mold flash. Unfortunately, mold flash can obscure the solder ball pad site, which can lead to poor of failed electrical interconnections. These electrical interconnect inconsistencies can cause unacceptable package yields and unacceptable device failures upon integration into consumer products. Needless to say, such inconsistencies can also increase production costs.

Thus, a need still remains for a reliable integrated circuit package system and method of fabrication, wherein the integrated circuit package system does not suffer from mold flash that obscures adjacent electrical patterns. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: a support structure including an electrical contact; a solder mask over the support structure, the solder mask including a solder mask flange, the solder mask flange directly on a support structure first surface; an integrated circuit over the support structure; and encapsulant over the integrated circuit and in contact with the solder mask flange. The present invention provides a mold system including: a first mold having a projection along a first mold bottom surface, the projection between a first cavity and a recess.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 6 is a cross-sectional view of a mold system in accordance with another embodiment of the present invention.

FIG. 7 is a cross-sectional view of a mold system in accordance with another embodiment of the present invention.

FIG. 8 is a flow chart of an integrated circuit package system for the integrated circuit package system, in accordance with an embodiment of the present invention.

BEST MODE FOR CARRYING OUT THE INVENTION

Figure 1:
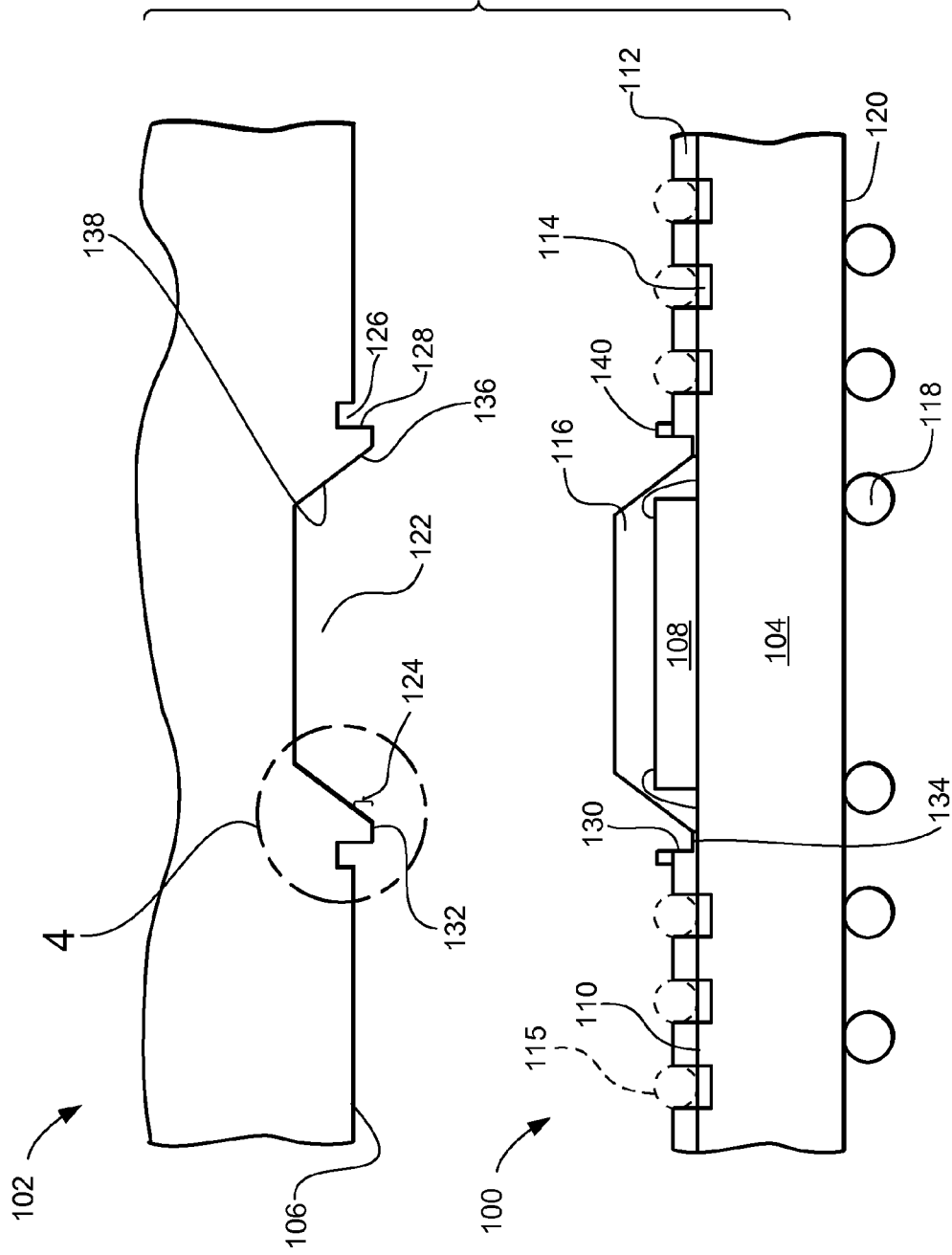
FIG. 1 is a cross-sectional view of an integrated circuit package system in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or active surface of an integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processed" or "processing" as used herein includes deposition of material or photoresist, patterning, exposure, development, etching, cleaning, and/or removal of the material or photoresist as required in forming a described structure. The terms "flash" or "bleed" are used herein to mean seepage of encapsulation material between surfaces in contact.

Referring now to FIG. 1, therein is shown a cross sectional view of an integrated circuit package system 100, in accordance with an embodiment of the present invention. The integrated circuit package system 100 is formed by employing a first mold 102 that prevents dispersion of flash between a support structure 104 and a first mold bottom surface 106. By way of example, the integrated circuit package system 100 produced by the first mold 102 can find application in vertically stacked configurations, such as, Package-on-Package (PoP) and Board-on-Chip (BoC). This embodiment focuses primarily upon PoP configurations.

The support structure 104 supports an integrated circuit 108. The support structure 104 may also support and electrically interconnect additional packages formed thereover. By way of example, the support structure 104 may include a printed wiring board or a semiconductor substrate; however, the support structure 104 is not to be limited to these examples. In accordance with the scope of the present invention, the support structure 104 may include any structure on or in which integrated circuit systems are fabricated. The support structure 104 may be part of a leadframe, tape and reel, or panel configuration, thereby allowing the processing of multiple package systems at a time.

The integrated circuit 108 is formed on the support structure first surface 110. The integrated circuit 108 may include semiconductor chips, integrated circuit systems, and integrated circuit packages selected from active components, passive components, stacked components, memory components, and so forth, in numerous configurations and arrangements as may be needed. It is to be understood that the integrated circuit 108 covers a wide range of semiconductor chip, integrated circuit system, and integrated circuit package configurations involving various sizes, dimensions, and electrical contact techniques (e.g.—surface mount or wire bond), and the type of chip, integrated circuit system, or package configuration employed should only be limited by the design specifications of the integrated circuit package system 100.

A solder mask 112 is also formed on the support structure first surface 110 around the integrated circuit 108 and an electrical contact 114. The solder mask 112 acts as a solder resist, thereby helping to define the electrical contact 114, such as, a solder ball pad. The electrical contact 114 can be designed to accommodate an electrical connection, such as a solder ball 115 shown in phantom outline, from a vertically stacked package formed thereover.

By way of example, the solder mask 112 may have a thickness of about 30 micrometers. However, the thickness of the solder mask 112 is not to be limited to this example. In accordance with the scope of the present invention, the thickness of the solder mask 112 may include any thickness, which exceeds the thickness/height of a projection 124 of the first mold 102.

An encapsulant 116 is formed over the integrated circuit 108. The encapsulant 116 may include an encapsulation material, such as, an epoxy or a resin that is injected through the first mold 102 into a first cavity 122 over the integrated circuit 108. The encapsulant 116 and its purpose are well known within the art and not repeated herein.

A terminal 118 is formed on a support structure second surface 120 to provide an electrical connection to external electrical circuits. For example, the terminal 118 may include a solder ball formed by solder reflow or by deposition techniques, such as physical or vapor deposition. However, the terminal 118 is not to be limited to the preceding example. In accordance with the scope of the invention, the terminal 118 may include any structure that provides an electrical contact between the support structure 104 and an external electrical circuit.

The first mold 102 includes the first mold bottom surface 106, the first cavity 122, the projection 124, and a recess 126. During formation of the integrated circuit package system 100, the first mold 102 engages the support structure 104 during injection of the encapsulant 116. As is evident from the disclosure herein, the first mold 102 includes a securing mechanism or means for joining/engaging the first mold 102 to the integrated circuit package system 100 and conduits for disbursement of an encapsulation material.

Notably, at least a portion of the integrated circuit 108 is recessed within the first cavity 122 during injection of the encapsulant 116 and the first mold bottom surface 106 is placed flush against the solder mask 112, thereby helping to prevent flashing/bleeding of the encapsulant 116. It is to be understood that the configuration of the first cavity 122 can be designed and engineered to accommodate any structure (e.g.—the integrated circuit 108) that requires a mold encapsulation adjacent a conductive pattern.

The first mold bottom surface 106 includes the projection 124 formed between the recess 126 and the first cavity 122. Stated another way, when the first mold 102 engages the support structure 104, the projection 124 and the recess 126 of the first mold 102 are located between at least a portion of the integrated circuit 108 and the electrical contact 114 of the integrated circuit package system 100. The projection 124 extends beyond the plane of the first mold bottom surface 106. By way of example, the projection 124 may extend about 5 to about 15 micrometers beyond the plane of the first mold bottom surface 106. However, it is to be understood that the projection 124 may be configured to extend any distance beyond the plane of the first mold bottom surface 106, so long as it extends less than the height/thickness of the solder mask 112, thereby helping to prevent damage to the support structure first surface 110.

A projection exterior side wall 128 of the projection 124 is configured and/or designed to lie against or abut a solder mask side wall 130. The projection exterior side wall 128 can be configured to provide a seal between itself and the solder mask side wall 130 that helps to prevent or retard the flow or bleeding of the encapsulant 116. Additionally, the projection 124 also forms a seal between a projection first surface 132 and a solder mask flange 134 that helps to prevent or retard the flow or bleeding of the encapsulant 116. The seal between the projection 124 and the solder mask 112 is formed due to the compression of the solder mask 112 during engagement with the first mold 102. It is this compression of the solder mask 112 by the first mold bottom surface 106 and the projection 124 that forms the solder mask flange 134. In at least one embodiment, the solder mask flange 134 can be formed directly on the support structure first surface 110 between the electrical contact 114 and the integrated circuit 108.

Accordingly, the projection 124 provides additional resistance against mold flashing by forming the seal between itself and the solder mask side wall 130 and the solder mask flange 134 that must be breached before the mold flash can leak between the first mold bottom surface 106 and the solder mask 112. A projection interior side wall 136 is continuous with a cavity side wall 138.

Another notable aspect of the present invention is the formation of the recess 126. Although the recess 126 is depicted as square in shape, the recess 126 may include any design or shape. In accordance with the scope of the present invention, it is to be understood that the design or shape of the recess 126 is not essential, what is important is that the recess 126 include a hollow space in which mold flash may accumulate.

The recess 126 is parallel to and offset from the cavity side wall 138. The recess 126 can be formed continuously along the perimeter of the first cavity 122 or it can be strategically formed in areas likely to suffer from mold flash. Stated another way, the recess 126 can be formed continuously, intermittently, or on one or more sides around the first cavity 122. However, it is to be understood that the recess 126 can be formed in any configuration or design that helps to prevent mold flash problems by collecting mold flash.

The present inventors have discovered that the recess 126 can act as a collection reservoir for mold flash that would normally bleed between the first mold bottom surface 106 and the solder mask 112. Consequently, any of the encapsulant 116 that escapes from the first cavity 122 is trapped within the recess 126 and does not obscure or contaminate the electrical contact 114. Accordingly, the present invention prevents the mold flash from the encapsulant 116 from affecting the electrical contact formation process for the electrical contact 114, and thereby improves product yield by preventing device failure due to failed or weakened electrical interconnects.

Additionally, the present inventors have discovered that the pressure within the recess 126 helps to deter and/or retard the dispersion of the mold flash. The pressure within the recess 126 may occur from air trapped within the recess 126 during attachment of the first mold 102 to the integrated circuit package system 100 or it may be artificially created by an external pressure control system connected to the recess 126 by conduits. However, these examples are not to be construed as limiting. In accordance with the scope of the present invention, the first mold 102 and the recess 126 may include any system or method that helps to retard dispersion of the mold flash by pressure differentiation.

Notably, the integrated circuit package system 100 includes an encapsulant flash 140. However, the formation of the encapsulant flash 140 is not required and the existence or non-existence of the encapsulant flash 140 can be controlled by the projection 124 and the recess 126. The encapsulant flash 140 can be formed over the support structure 104, or more specifically, the encapsulant flash 140 can be formed over the solder mask 112. The encapsulant flash 140 represents the mold flash that leaked between the first mold 102 and the solder mask 112 during formation of the encapsulant 116. As exemplary illustrations, the encapsulant flash 140 can be formed continuously, intermittently, or on one or more sides around the integrated circuit 108.

The present inventors have discovered that by configuring the first mold 102 to include the first cavity 122 with the projection 124 formed adjacent the recess 126 that the encapsulant flash 140 can be confined to a region of the solder mask 112 that does not obscure the electrical contact 114. For purposes of illustration, the encapsulant flash 140 can be confined to a region of the solder mask 112 that is defined by the recess 126 of the first mold 102. Notably, the encapsulant flash 140 need not cover the entire region of the solder mask 112 defined by the recess 126.

The present inventors have discovered that the formation of the encapsulant flash 140 is affected by the projection 124 and the recess 126. By way of example, the encapsulant flash 140 can be affected by the projection 124 because the seal between the projection 124 and the solder mask side wall 130 and the solder mask flange 134 helps to prevent or retard the dispersion of the mold flash. Additionally, by way of example, the encapsulant flash 140 can be affected by the recess 126 because pressure within the recess 126 helps to prevent or retard the flow of mold flash. Accordingly, the projection 124 and/or the recess 126 can stop the formation of the encapsulant flash 140. As exemplary illustrations, the movement of the mold flash can be stopped between the first cavity 122 and the projection 124 and/or the movement of the mold flash can be stopped between the first cavity 122 and the recess 126.

Circle 4 will be described in greater detail in FIG. 4.

Figure 2:
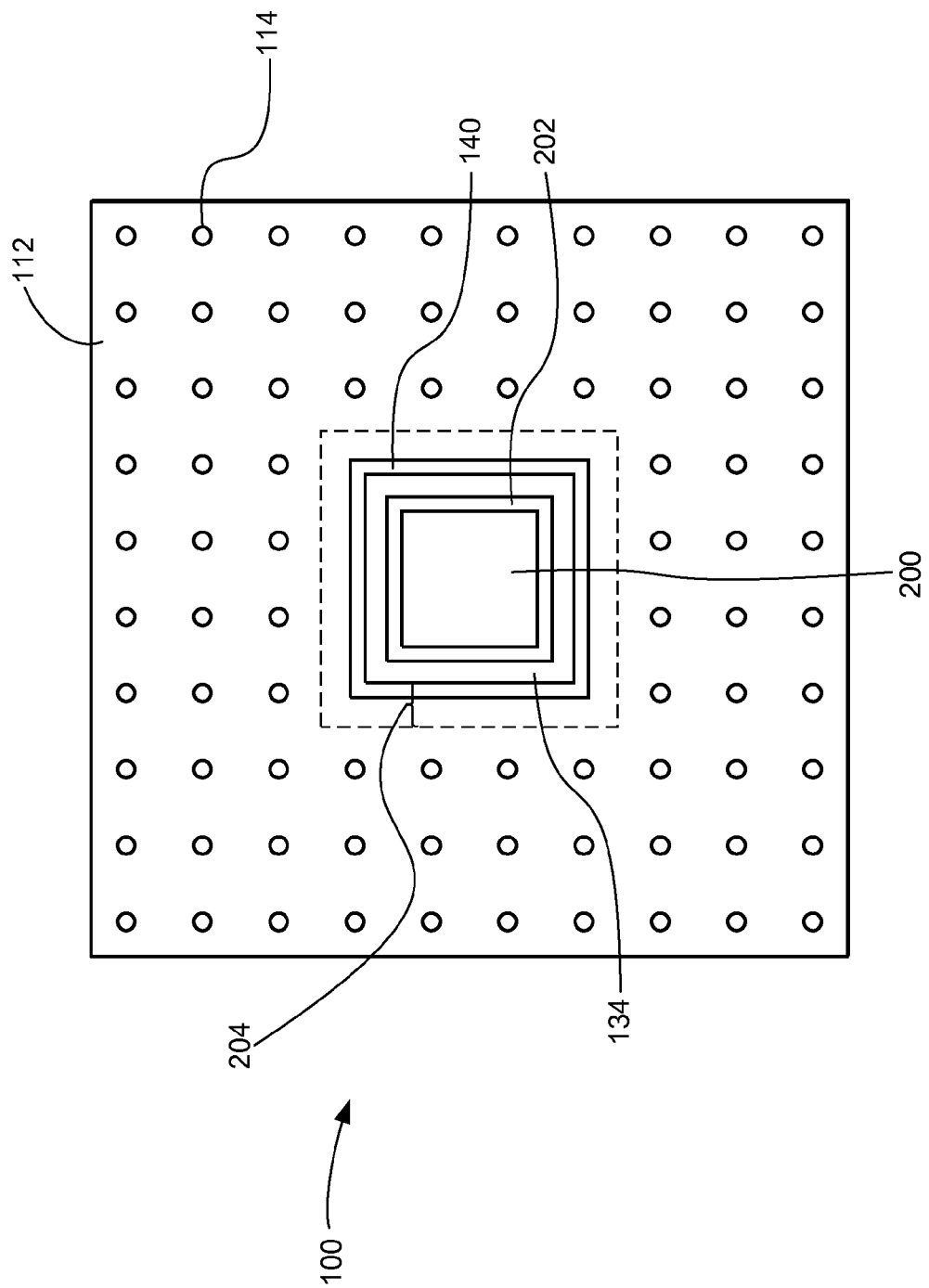
FIG. 2 is a top view of the integrated circuit package system in accordance with an embodiment of the present invention.

Referring now to FIG. 2, therein is shown a top view of the integrated circuit package system 100, of FIG. 1 in accordance with an embodiment of the present invention. This view of the integrated circuit package system 100 depicts the solder mask 112, the electrical contact 114, the solder mask flange 134, the encapsulant flash 140, an encapsulant top surface 200, an encapsulant side wall 202, and a recess coverage area 204. The recess coverage area 204 is bounded by the solder mask flange 134 on one side and by an exterior recess side wall 408, of FIG. 4, on the opposing side. For purposes of clarity, the boundary created by the exterior recess side wall 408 is shown in phantom outline. The recess coverage area 204 exemplifies the space available for the encapsulant flash 140 to occupy. However, this illustration clearly depicts that the encapsulant flash 140 need not occupy the entire area/space of the recess coverage area 204. As is evident from the disclosure herein, the dimensions of the recess coverage area 204 are substantially equivalent to those of the recess 126, of FIG. 1.

Figure 3:
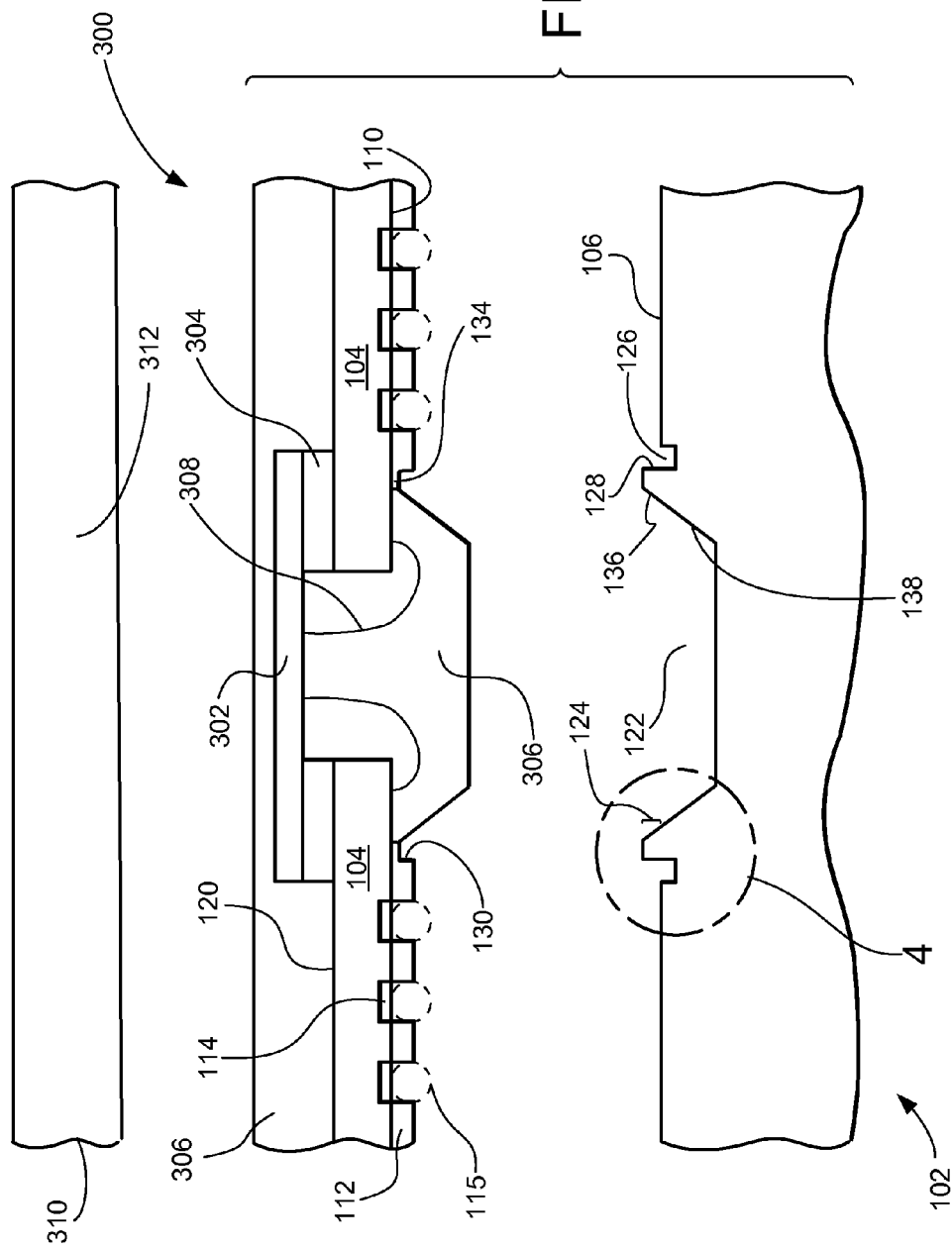
FIG. 3 is a cross-sectional view of an integrated circuit package system in accordance with another embodiment of the present invention.

Referring now to FIG. 3. FIG. 3 depicts a similar configuration as to that shown in FIG. 1, and consequently, only the differences between the figures will be described, to avoid redundancy.

FIG. 3 depicts a cross sectional view of an integrated circuit package system 300, in accordance with another embodiment of the present invention. The integrated circuit package system 300 is also formed by employing the first mold 102. The first mold 102 helps to prevent mold flash dispersion between the support structure 104 and the first mold bottom surface 106. By way of example, the integrated circuit package system 300 produced by the first mold 102 can find application in vertically stacked configurations. This embodiment focuses primarily upon Board-on-Chip (BoC) configurations.

The integrated circuit package system 300 includes the first mold 102, the support structure 104, the first mold bottom surface 106, the support structure first surface 110, the solder mask 112, the electrical contact 114, the support structure second surface 120, the first cavity 122, the projection 124, the recess 126, the projection exterior side wall 128, the solder mask side wall 130, the solder mask flange 134, the projection interior side wall 136, the cavity side wall 138, the encapsulant flash 140 of FIG. 1, an integrated circuit 302, an inter-device structure 304, an encapsulant 306, a feature 308, a second mold 310, and a second cavity 312.

The integrated circuit 302 is formed over the support structure second surface 120. The inter-device structure 304, such as, an adhesive with or without thermally conducting capabilities, a spacer, an electromagnetic interference shield for blocking potentially disruptive energy fields, or a combination thereof, can be formed between the integrated circuit 302 and the support structure second surface 120. Although the present embodiment only depicts one of the integrated circuit 302 formed over the support structure second surface 120, it is to be understood that any number of the device(s) 302 can be formed over the support structure second surface 120 in a planar or vertically stacked configuration.

The integrated circuit 302 may include semiconductor chips, integrated circuit systems, and integrated circuit packages selected from active components, passive components, stacked components, memory components, and so forth, in numerous configurations and arrangements as may be needed. It is to be understood that the integrated circuit 302 covers a wide range of semiconductor chip, integrated circuit system, and integrated circuit package configurations involving various sizes, dimensions, and electrical contact techniques, and the type of chip, integrated circuit system, or package configuration employed should only be limited by the design specifications of the integrated circuit package system 300.

As an exemplary illustration, the encapsulant 306 can be formed by engaging the support structure first surface 110 and the support structure second surface 120 with the first mold 102 and the second mold 310, respectively. After the first mold 102, the second mold 310 and the support structure 104 are engaged, the second cavity 312 of the second mold 310 is filled or injected with an encapsulation material and the encapsulation material flows through holes within the support structure 104 to fill the first mold 102. Per this illustration, the first mold 102 may possess one or more of the first cavity 122, wherein each one of the first cavity 122 corresponds to the feature 308, and the second mold 310 may possess a single large cavity, such as the second cavity 312, defined by the perimeter of the support structure second surface 120. However, formation of the encapsulant 306 is not to be limited to the above example and may include various mold injection methods and techniques.

As is evident from the disclosure herein, the first mold 102 and the second mold 310 both include a mechanism or means for joining/engaging the first mold 102 and the second mold 310 to the support structure 104. Additionally, as is evident from the disclosure herein, the first mold 102 and the second mold 310 may each include conduits for disbursement of an encapsulation material.

Regardless of the injection method for the encapsulation material, the encapsulant 306 forms an encapsulation mold around the integrated circuit 302 and the feature 308. Per this embodiment, the feature 308 may include an electrical connection, such as a wire bond. For example, if the feature 308 is a wire bond, then the wire bond can be formed by using materials and techniques well known within the art and is currently only limited by the technology of wire bond equipment and the minimum required operating space Notably, the feature 308 is recessed within the first cavity 122 during injection of the encapsulation material and the first mold bottom surface 106 is placed flush against the solder mask 112, thereby helping to prevent flashing of the encapsulant 306. It is to be understood that the configuration of the first cavity 122 can be designed and engineered to accommodate any structure (e.g.—the feature 308) that requires a mold encapsulation adjacent a conductive pattern.

Notably, the first mold 102 of the present embodiment includes the projection 124 formed between the recess 126 and the first cavity 122. Stated another way, when the first mold 102 engages the support structure 104, the projection 124 and the recess 126 of the first mold 102 are located between the feature 308 and the electrical contact 114 of the integrated circuit package system 300.

As with the integrated circuit package system 100, of FIG. 1, the projection 124 of the present embodiment forms a seal with the solder mask side wall 130 and the solder mask flange 134, thereby helping to prevent or retard flashing of the encapsulant 306, while the recess 126 retards and collects any flash that leaks between the solder mask 112 and the first mold 102. In at least one embodiment, the solder mask flange 134 can be formed directly on the support structure first surface 110 between the electrical contact 114 and the feature 308. Consequently, the electrical contact 114 is not obscured, and an electrical connection, such as the solder ball 115 shown in phantom outline, can be used to electrically connect the integrated circuit package system 300 to an external circuit.

Notably, the integrated circuit package system 300 does not depict formation of the encapsulant flash 140, of FIG. 1; however, the present embodiment may include the formation of the encapsulant flash 140 if process conditions produce such a result. Per this embodiment, the pressure within the recess 126 and the seal between the projection 124 and the solder mask side wall 130 and the solder mask flange 134 is sufficient to prevent the formation of the encapsulant flash 140. Accordingly, the electrical contact 114 is not obscured by mold flashing and thereby improves product yield by preventing device failure due to failed or weakened electrical interconnections between adjacent structures.

Circle 4 will be described in greater detail in FIG. 4.

Figure 4:
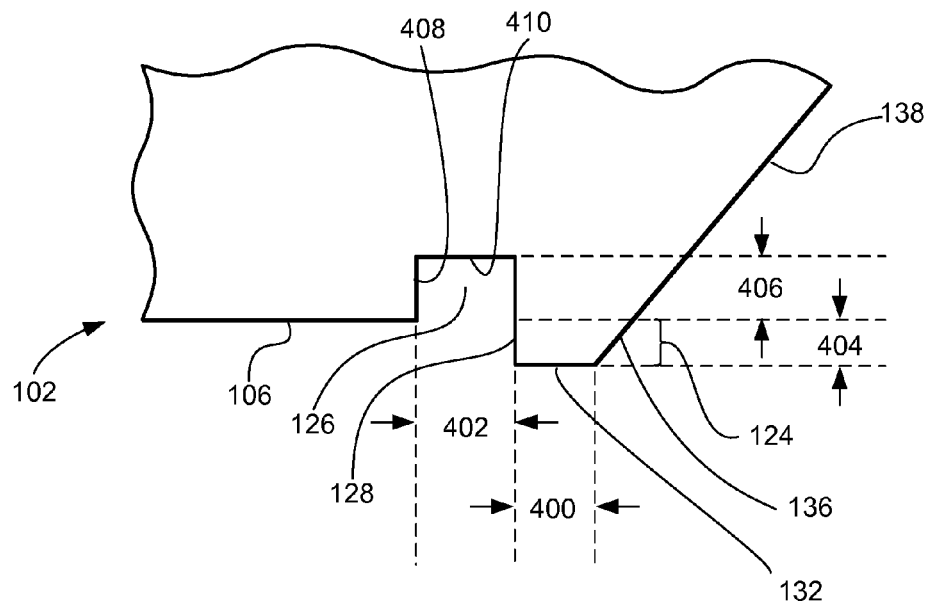
FIG. 4 is an enlarged view of a circle 4, of FIGS. 1 and 3.

Referring now to FIG. 4, therein is shown an enlarged view of a circle 4, of FIGS. 1 and 3. For purposes of discussion, the circle 4, of FIG. 3, has been inverted to match the orientation of the circle 4, of FIG. 1. The circle 4 depicts a portion of the first mold 102 including the first mold bottom surface 106, the projection 124, the recess 126, and the cavity side wall 138.

Notably, FIG. 4 depicts four distance dimensions: a dimension 400, a dimension 402, a dimension 404, and a dimension 406. However, it is to be understood that the following distance dimensions are merely exemplary and are not intended to limit the scope of the present invention.

For example, the dimension 400 is the distance between the projection exterior side wall 128 and the projection interior side wall 136. The dimension 400 can vary between about 50 to about 100 micrometers. Further, by way of example, the dimension 402 is the distance between the projection exterior side wall 128 and the exterior recess side wall 408. The dimension 402 can vary between about 50 to about 100 micrometers. Additionally, by way of example, the dimension 404 is the distance between the first mold bottom surface 106 and the projection first surface 132. The dimension 404 can vary between about 5 to about 15 micrometers when the solder mask 112, of FIGS. 1 and 3, is about 30 micrometers. Finally, by way of example, the dimension 406 is the distance between the first mold bottom surface 106 and a recess first surface 410. The dimension 406 can vary between about 30 to about 200 micrometers.

The present inventors have noted that the projection 124 can cause some damage to the support structure 104, of FIGS. 1 and 3, if the height (i.e.—the dimension 404) of the projection 124 exceeds the thickness of the solder mask 112, of FIGS. 1 and 3. Damage to the support structure 104 can be avoided by making the dimension 404 less than the thickness of the solder mask 112 or by compressing the solder mask 112 to form the solder mask flange 134 underneath the projection 124.

Figure 5:
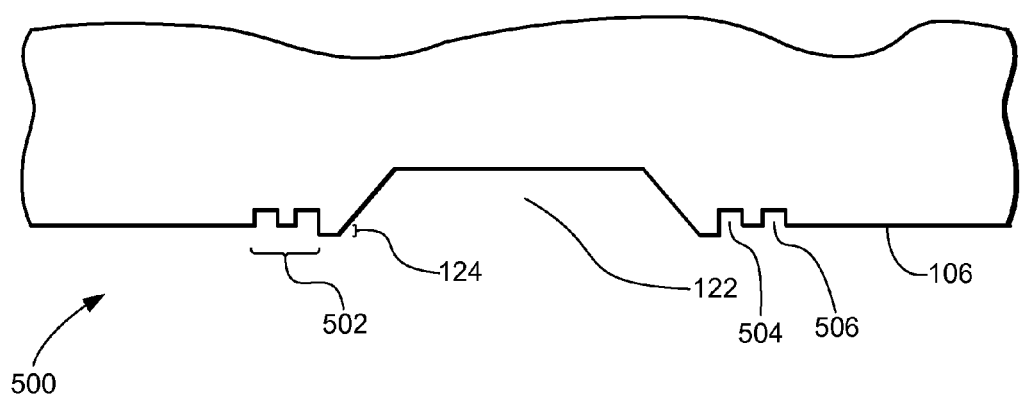
FIG. 5 is a cross-sectional view of a mold system in accordance with another embodiment of the present invention.

Referring now to FIG. 5, therein is shown a cross sectional view of a first mold 500, in accordance with another embodiment of the present invention. The first mold 500 can be used in place of the first mold 102, of FIGS. 1 and 3, or, more generally, the first mold 500 can be used in any application that requires an encapsulation mold adjacent a conductive pattern. The first mold 500 includes the first mold bottom surface 106, the first cavity 122, the projection 124, a recess 502, a first opening 504, and a second opening 506.

Notably, the recess 502 of the present embodiment includes the first opening 504 and the second opening 506.

However, it is to be understood that the first mold 500 is not to be limited to the first opening 504 and the second opening 506 configuration. In accordance with the scope of the present invention, the first mold 500 may include any number of openings (e.g.—two or more), which helps to prevent the contamination of the electrical contact 114, of FIGS. 1 and 3, by mold flash.

By forming the second opening 506 adjacent the first opening 504, any mold flash that is not captured by the first opening 504 is collected or retained by the second opening 506. The second opening 506 acts as an additional collection reservoir for mold flash, and thereby, further prevents the dispersion or flashing of the encapsulant 116 of FIG. 1 and the encapsulant 306 of FIG. 3, over the electrical contact 114. Furthermore, the pressure within the second opening 506 may also prevent the dispersion of flash by deterring or retarding its flow.

As is evident from the disclosure herein, the first mold 500 would produce the integrated circuit package system 100 or 300, of FIGS. 1 and 3, with two or more of the encapsulant flash 140 of FIG. 1 and discussed in FIG. 3. Stated another way, the encapsulant flash 140 formed by the first mold 500 would be defined by the first opening 504 and the second opening 506. For purposes of illustration, the encapsulant flash 140 produced by the first mold 500 may include a first encapsulant flash corresponding with the first opening 504 and a second encapsulant flash corresponding with the second opening 506.

Referring now to FIG. 6, therein is shown a cross sectional view of the first mold 102, in accordance with another embodiment of the present invention. However, it is to be understood that the concepts discussed with regards to this embodiment are equally applicable to the first mold 500, of FIG. 5. Per this embodiment, the recess 126 is formed in the shape of a triangle; however, this example is not to be construed as limiting and the design or shape of the recess 126 may include any poly-sided configuration. In accordance with the scope of the present invention, it is to be understood that the design or shape of the recess 126 is not essential, what is important is that the recess 126 include a hollow space in which the encapsulant flash 140, of FIG. 1, may accumulate.

Referring now to FIG. 7, therein is shown a cross sectional view of the first mold 102, in accordance with another embodiment of the present invention. However, it is to be understood that the concepts discussed with regards to this embodiment are equally applicable to the first mold 500, of FIG. 5. Per this embodiment, the recess 126 is formed in the shape of a circle or oval; however, this example is not to be construed as limiting and the design or shape of the recess 126 may include any curved or arced configuration. In accordance with the scope of the present invention, it is to be understood that the design or shape of the recess 126 is not essential, what is important is that the recess 126 include a hollow space in which the encapsulant flash 140, of FIG. 1, may accumulate.

Referring now to FIG. 8, therein is shown a flow chart of a method 800 for the integrated circuit package system 100 in accordance with an embodiment of the present invention. The method 800 includes providing an integrated circuit and a solder mask over a support structure including an electrical contact, the solder mask including a solder mask flange, the solder mask flange directly on a support structure first surface in a block 802; providing a first mold having a first cavity with a projection and a recess in a block 804; engaging the first mold on the support structure with the first cavity over at least a portion of the integrated circuit and the projection and the recess between the at least a portion of the integrated circuit and the electrical contact in a block 806; and injecting encapsulation material into the first cavity to form an encapsulant over the integrated circuit and a mold flash adjacent the encapsulant in a block 808.

It has been discovered that the present invention thus has numerous aspects. A principle aspect is that the present invention employs a first mold that collects mold flash. By employing a recess that collects mold flash, the first mold of the present invention helps to prevent obscuring of an electrical contact by mold bleed.

Another aspect of the present invention is that it includes a first mold, which helps to retard the flow of mold flash. The present invention achieves this objective by maintaining a pressure within the recess that helps to deter the dispersion of the mold flash.

Another aspect of the present invention is that it produces an integrated circuit package system with an exposed electrical contact that does not require additional processing steps, such as, de-flashing.

Another aspect of the present invention is that it produces an integrated circuit package system with a high interconnect reliability, thereby reducing defective package configurations and costs. The present invention achieves this objective by preventing mold flash formation over an electrical contact, and consequently, reduces the likelihood of electrical contact failure due to dielectric formation over the electrical contact.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for preventing electrical contact failure due to mold bleed between a mold system and a support structure. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   a support structure including an electrical contact;
   a solder mask over the support structure, the solder mask including a solder mask flange, the solder mask flange directly on a support structure first surface;
   an integrated circuit over the support structure; and
   encapsulant over the integrated circuit and in contact with the solder mask flange.

2. The system as claimed in claim 1 further comprising an encapsulant flash adjacent the encapsulant and on the solder mask.

3. The system as claimed in claim 1 wherein the solder mask is around the integrated circuit and the electrical contact.

4. The system as claimed in claim 1 wherein the solder mask flange faces the encapsulant.

5. The system as claimed in claim 1 wherein the solder mask flange is in contact with the encapsulant.

\* \* \* \* \*